United States Patent
Sooriakumar et al.

[11] Patent Number: 6,127,629
[45] Date of Patent: Oct. 3, 2000

[54] HERMETICALLY SEALED MICROELECTRONIC DEVICE AND METHOD OF FORMING SAME

[75] Inventors: Kathirgamasundaram Sooriakumar, Tempe, Ariz.; Allen Henry Meitzler; Shaun Leaf McCarthy, both of Ann Arbor, Mich.; Russell J. Haeberle, Plymouth, Mich.

[73] Assignee: Ford Global Technologies, Inc., Dearborn, Mich.

[21] Appl. No.: 08/316,753

[22] Filed: Oct. 3, 1994

[51] Int. Cl.⁷ ........................................ H05K 5/06
[52] U.S. Cl. ................. 174/52.3; 257/633; 257/649; 257/650
[58] Field of Search .............. 174/52.4; 73/715, 73/721, 727, 756; 361/283.1, 283.2, 283.3, 283.4; 257/633, 644, 649, 650

[56] References Cited

U.S. PATENT DOCUMENTS

| | | | |
|---|---|---|---|
| 3,669,734 | 6/1972 | Jacob et al. | 117/217 |
| 3,755,720 | 8/1973 | Kern | 317/234 R |
| 4,191,905 | 3/1980 | Yasuda et al. | 310/344 |
| 4,464,419 | 8/1984 | Horn | 427/58 |
| 4,701,826 | 10/1987 | Mikkor | 361/283 |
| 4,716,082 | 12/1987 | Ahearn et al. | 428/428 |
| 4,773,972 | 9/1988 | Mikkor | 204/16 |
| 4,995,149 | 2/1991 | Arvikar et al. | 29/25.35 |
| 5,141,148 | 8/1992 | Ichiyawa | 228/263 |

*Primary Examiner*—Kristina Kincaid
*Assistant Examiner*—Hung V Ngo
*Attorney, Agent, or Firm*—Joseph W. Malleck

[57] ABSTRACT

A microelectronic device is hermetically sealed at the wafer level. A substrate is provided having associated electronics and at least one metal bonding pad. A dielectric layer, such as pyrex glass film, is sputter deposited atop the substrate to form a glass/metal seal. A glass film is thereafter planarized, preferably by chemical-mechanical polishing, to remove surface variations. A cover wafer is thereafter anodically bonded to the dielectric layer/glass film so as to define a sealed cavity for housing and protecting the substrate electronics. The resultant microelectronic device is packaged in its own hermetically sealed container at the wafer level.

6 Claims, 3 Drawing Sheets

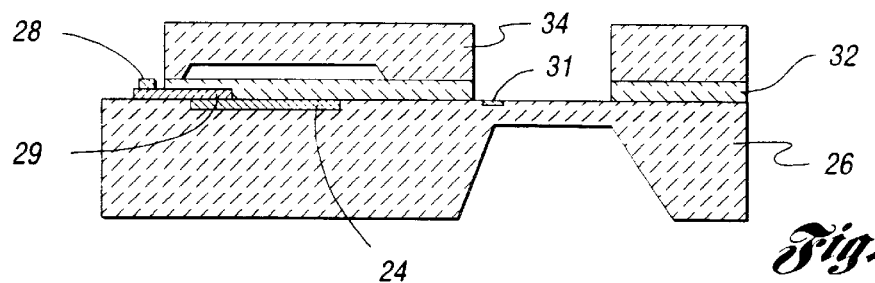

Fig. 4

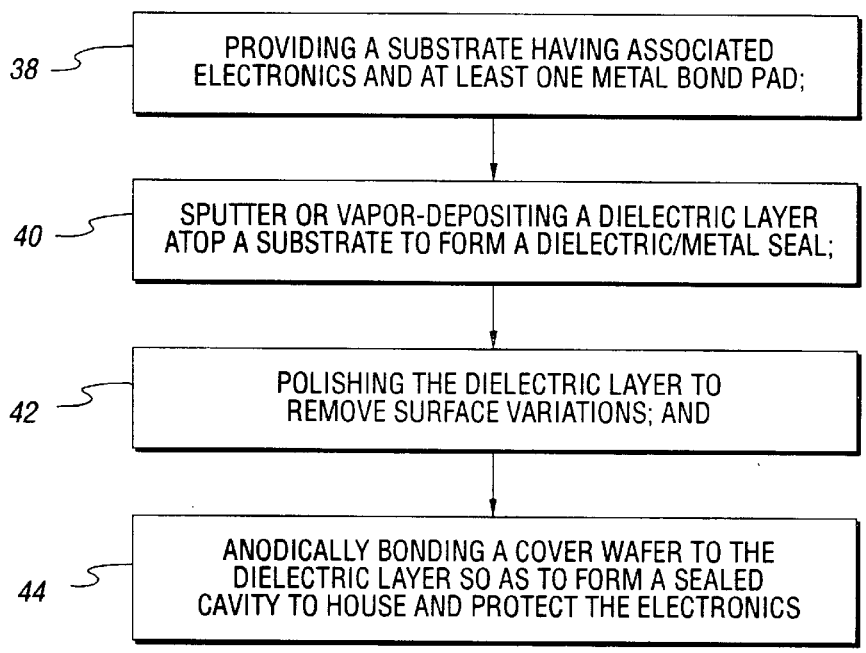

| | |
|---|---|
| 38 | PROVIDING A SUBSTRATE HAVING ASSOCIATED ELECTRONICS AND AT LEAST ONE METAL BOND PAD; |
| 40 | SPUTTER OR VAPOR-DEPOSITING A DIELECTRIC LAYER ATOP A SUBSTRATE TO FORM A DIELECTRIC/METAL SEAL; |
| 42 | POLISHING THE DIELECTRIC LAYER TO REMOVE SURFACE VARIATIONS; AND |
| 44 | ANODICALLY BONDING A COVER WAFER TO THE DIELECTRIC LAYER SO AS TO FORM A SEALED CAVITY TO HOUSE AND PROTECT THE ELECTRONICS |

Fig. 5

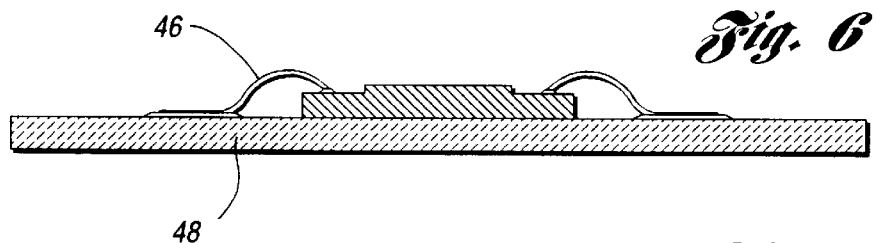

Fig. 6

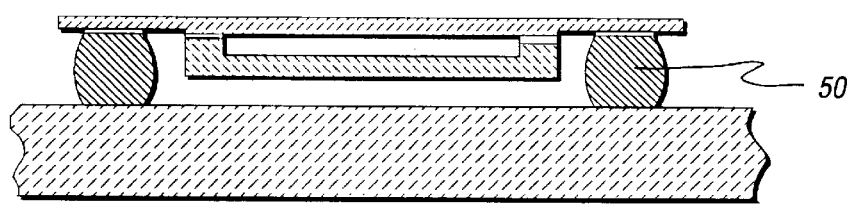

Fig. 7

HERMETICALLY SEALED MICROELECTRONIC DEVICE AND METHOD OF FORMING SAME

TECHNICAL FIELD

This invention relates generally to integrated circuits and, more particularly, to the packaging of individual microelectronic devices such as Integrated Circuit (IC) chips and silicon-based sensors.

BACKGROUND ART

The packaging of microelectronic devices such as Integrated Circuits (ICs) and silicon-based sensors has been a major challenge since the invention of the microchip. While packaging is generally the last step in the overall fabrication process, the handling and packaging of individual circuits can be the most critical steps of all from considerations of cost and reliability.

As those skilled in the art will recognize, the individual IC chips/silicon-based sensors must be connected properly to outside leads and packaged in a way that is convenient for use in a larger circuit or system. The packaging must also be within a suitable medium which can protect the chip from the environment of its intended application. In most cases, this means that the surface of the device must be isolated from moisture and contaminants. The associated bonds and other elements must further be protected from corrosion and mechanical shock.

The approaches found in prior art for obtaining hermetically sealed electronic devices are disclosed, for example, in U.S. Pat. Nos. 4,995,149; 4,716,082; 4,464,419; 4,191,905; 3,755,720; and 3,669,734.

U.S. Pat. No. 4,995,149, issued to Arvikar et al., discloses a method for hermetically sealing electronic devices at the chip level of fabrication. In operation, glass is deposited through a mask and is deposited in the form of a surface film. Preheating and melting are also used to form the seal.

U.S. Pat. No. 3,755,720, issued to Kern, discloses an encapsulation procedure which passivates the surface of a semi-conductor device and encapsulates the surface and leads in glass. Again, encapsulation is done on the individual device at the chip level in the fabrication process.

U.S. Pat. No. 4,716,082, issued to Ahearn et al., discloses a glass-to-metal sealing process for manufacturing microcircuit chips. Again, the process provides for sealing at the chip level and further uses a pre-form.

U.S. Pat. No. 4,464,419, issued to Horn, discloses a process performed on individual devices to provide a quasi-hermetic covering of susceptible physical structures.

U.S. Pat. No. 4,191,905, issued to Yasuda et al., discloses a sealed housing for sub-miniature piezo-electric vibrators which accomplishes encapsulation of miniature piezo-electric resonators by bonding a metal cover plate to a glass substrate.

U.S. Pat. No. 3,755,730, issued to Kern, is directed to a glass encapsulated semi-conductor device. The patent discloses a technique for removing the glass covering from a bonding pad and simultaneously depositing a solderable metal film. As disclosed by Kern, the encapsulation procedure also occurs at the chip level after the wafer is diced.

Inherent in all packaging processes is the need that connection to the microelectronic micro devices must be made from the outside world, yet the devices themselves must be protected from the world environment because of the above-referenced damage and influences of water, vapor, chemical contamination, etc.

In the early days of Integrated Circuit technology, most microelectronic devices were packaged in metal headers. In this process, the devices were alloyed to the surface of the header, wire bonds were then made to the header posts, and a metal lid was welded over the device and wiring. This packaging method provided complete sealing of the unit from the outside environment and was often referred to as a "hermetically sealed" device. After the chip was mounted on the header and bonds were made to the posts, the header cap could be welded shut in a controlled environment, such as, for example, an inert gas, which maintains the device in a prescribed atmosphere.

Because of the numerous lead connections involved, most integrated circuits are now mounted in packages 10 similar to that shown in FIG. 1. As those skilled in the art will recognize, this is one form of a Dual In-line Package (DIP), in which connectors or leads 12 are brought out along two sides of the package 10. After mounting the chip on a stamped metal lead frame 14 and forming the contacts, the package 10 is formed by applying a ceramic or plastic case 16 and trimming away the unwanted parts of the lead frame 14. Wire leads 18, usually gold or aluminum, are used to attach the chip 20 to lead frame 14.

In addition to the sealed metal containers identified above, ceramic, ceramic packages and molded epoxy resin bodies have also been utilized. In all cases, however, the conductors needed to make the connection between the outside world and the microelectronic device must still pass out of the electronic package. The interface between the packaging material and the connecting wires or leads have often been the avenue of contamination for the packaged devices, thus limiting their lifetime in the sometimes harsh environments of certain applications.

The most successful interface seal used to date has been the metal-glass seal in the hermetic package when the glasses are chosen to match the thermal expansion characteristics of the wire interconnect. The conventional hermetic package, while effective in the harshest environments, however, is nonetheless expensive and bulky in order to accommodate the metal seals in the regions of glass-metal seals.

In addition, the conventional hermetic package as well as other packaging schemes known to date, have utilized lead frames as shown in FIG. 1 which allow internal connections with bonding wires between the interconnect lead frames and the microelectronic chips or sensors. The need for this intermediate stage between the microchip and the electrical connection to the system has, understandably, increased costs, assembly, handling and production time. In addition, this intermediate step is highly labor intensive and often requires exportation of the microchips to manufacturing facilities for assembly into packages. This process further increases the risk of failures due to improper handling and lack of assembly-room environmental controls.

Consequently, there has developed a need for a packaging scheme that allows hermetic sealing and encapsulation of microelectronic devices to be done at the wafer level in order to reduce costs, improve reliability and enable assembly at a higher production rate with less human labor involvement. Such a packaging scheme should be capable of being completed in the same facility as that used to fabricate the microelectronic device, i.e., microchip or silicon-based sensor.

DISCLOSURE OF THE INVENTION

It is a general object of the present invention to provide a method of forming a hermetically sealed microelectronic device having leads/interconnects integral with the device.

It is a further object of the present invention to provide a method as above wherein the resultant device, i.e., microchip or silicon-based sensor, is packaged in its own hermetically sealed container at the wafer level before the device is individually separated through dicing operations thus obviating the need for an intermediate lead frame and substantially reducing the attendant labor and manufacturing costs.

In carrying out the above-stated objects, features and advantages of the present invention, there is provided a method of forming a hermetically sealed microelectronic device at the wafer level. The method includes the provision of a substrate which is preferably but not necessarily a silicon wafer having associated electronics and at least one metal bonding pad. A dielectric layer which is preferably, but not necessarily, a pyrex glass film, is sputter-deposited or vapor-deposited by chemical vapor deposition methods atop the substrate wafer to a thickness of approximately 2 microns so as to form a glass/metal seal. In a preferred embodiment, the dielectric material is selected so as to thermally match the coefficient of expansion of the substrate and the etched wafer which is hereinafter disclosed. Thereafter, the deposited dielectric layer/glass film is planarized such as, for example, by chemical-mechanical polishing to remove surface variations preferably in excess of 1000 angstroms. Finally, an etched wafer, which is preferably silicon on the order of 500 microns in thickness is anodically bonded to the dielectric layer/glass film so as to define a sealed cavity to house and protect the substrate electronics. The resultant combination of wafers contain many microelectronic devices, each packaged in its own hermetically sealed structure at the wafer level.

Also in accordance with the present invention, after the wafer assembly is diced into individual devices, there is provided a hermetically sealed microelectronic device which is made in accordance with the teachings of the present invention. The microelectronic device includes a substrate which, as above, includes associated electronics and at least one metal bond and preferably is formed from a silicon wafer on the order of 500 microns in thickness. A dielectric layer which is preferably a pyrex glass film having a thickness on the order of 2 microns is also provided. The film is sputter or vapor-deposited atop the substrate, thermally matched to both the substrate and the etched wafer, chemically-mechanically polished, and joined by an anodic bonding process so as to form a glass/metal seal. Still further, a piece of an etched wafer is provided which is preferably silicon having a thickness of 500 microns. The etched wafer is anodically bonded to the dielectric layer/pyrex glass film, as above, so as to form a glass/silicon seal having a cavity defined therebetween. Again, as in the above method, the resultant microelectronic device is packaged in its own hermetically sealed container at the wafer level via the glass/silicon seal.

These and other objects, features and advantages of the present invention will become more readily apparent by reference to the detailed description of the best mode for carrying out the invention wherein like reference numerals correspond to like components.

BRIEF DESCRIPTION OF THE DRAWINGS

FIG. 4 is a detailed schematic cross-sectional diagram of the pressure sensor of FIG. 2 following the packaging steps of FIGS. 3a–3d;

FIG. 5 is a generalized block diagram of the method steps of the present invention; and FIGS. 6–7 are schematic diagrams of typical connection arrangements between the microelectronic device of the present invention and a circuit board.

BEST MODE FOR CARRYING OUT THE INVENTION

Figure 2:
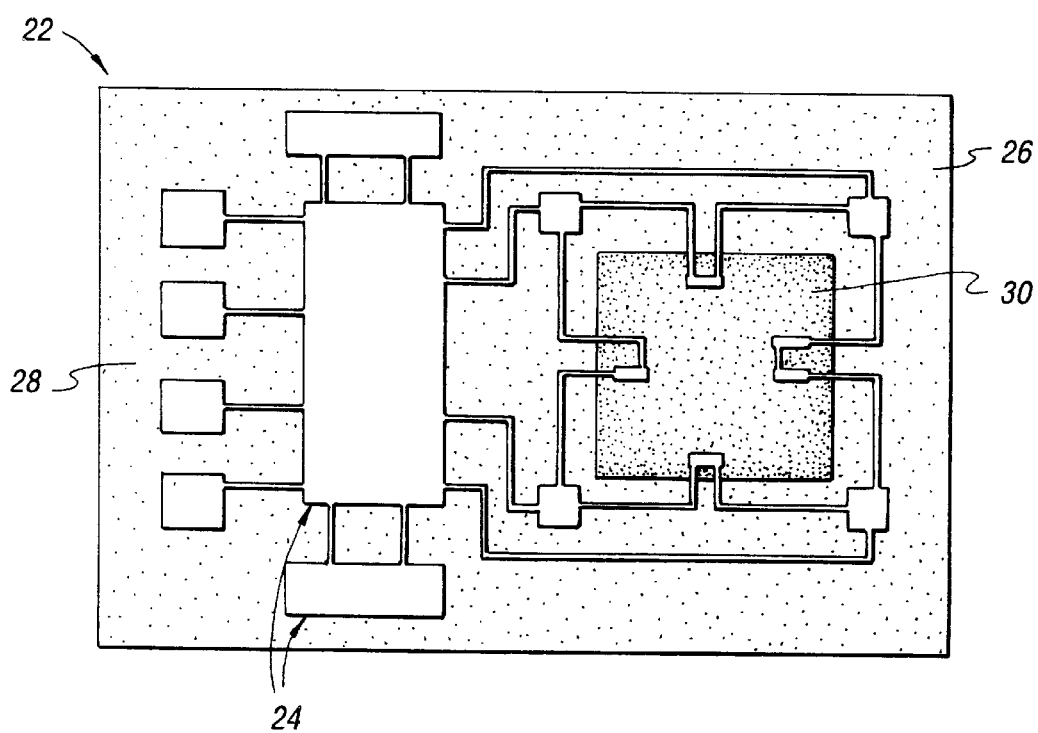
FIG. 2 is a schematic diagram of a generic piezo-resistive pressure sensor used for exemplary purposes to demonstrate the packaging process of the present invention.

Turning now to FIG. 2 of the drawings, there is provided a generic pressure sensor designated generally by reference numeral 22 which has been selected as an example to demonstrate the unique packaging process of the present invention. Pressure sensor 22 is a piezoresistive pressure sensor with circuitry 24 integrated on the same chip. As readily understood by those skilled in the art, however, in a real world application, this could be any microelectronic device (integrated circuit or sensor). Pressure sensor 22 includes a silicon substrate 26, at least one and preferably a plurality of bond pads 28, and in this example, a diaphragm 30.

Figure 3A:
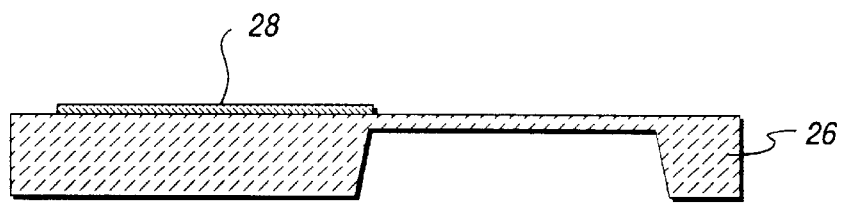
FIGS. 3a–3d are schematic cross-sectional diagrams of the generic pressure sensor of FIG. 2 used to illustrate the packaging steps of the present invention.

With reference to FIGS. 3a–3d of the drawings, the processing steps for packaging the piezoresistive pressure sensor 22 may now be described in further detail. As shown in FIG. 3a, the piezo-resistive pressure sensor 22 includes a substrate 26, which preferably comprises silicon on the order of 500 microns in thickness and a bond pad 28. In keeping with the invention, a dielectric layer such as a pyrex glass film 32 is sputter-deposited on the silicon substrate 26, preferably to a thickness of approximately 2 microns. The dielectric layer/glass film 32 is specifically chosen to match the thermal expansion of substrate 26 and cover wafer 34 which is disclosed in further detail below.

As those skilled in the art will recognize, it is desirable to match the thermal expansion coefficients of the several layers that make up the device so that, in normal operation of the microelectronic device and in the anodic bonding steps hereinafter described, extra stresses are not introduced which may lead to cracking of the device. In practice, any dielectric material may be suitable so long as it is provided with an oxide base and includes mobile alkaline ions which are necessary in order to oxidize the surface of the joining part thereby forming a bond.

Figure 3B:
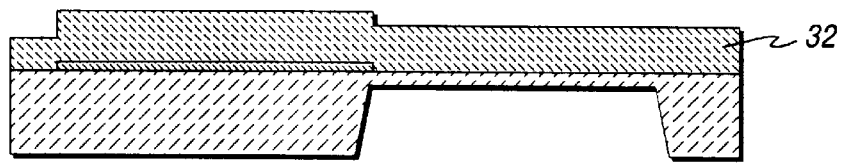
Figure 3C:
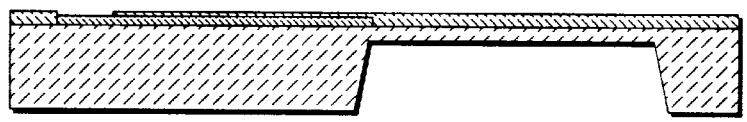
Figure 3D:
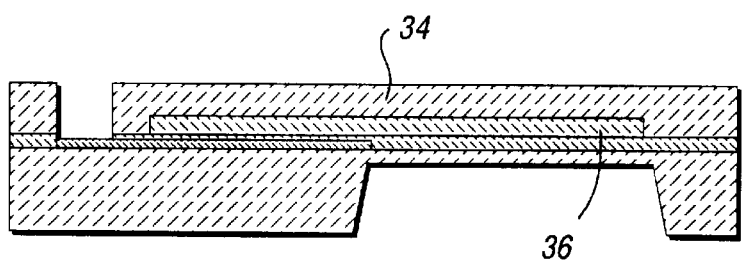

As shown in FIG. 3b, any variations in the surface of substrate 26 as a result of other structures being there such as interconnecting electrodes etc., will be mirrored in the surface obtained after sputter-depositing the dielectric layer 32. To obtain a smooth final surface necessary for anodic bonding, dielectric layer/glass film 32 must therefore by planarized so as to remove the undesired surface variations. In the preferred embodiment, this planarizing is accomplished through the use of chemical-mechanical polishing so as to remove surface variations greater than 1000 angstroms. The smooth surface that results allows anodic bonding to be done at lower temperatures with lower applied voltages, resulting in reduced residual stresses in the composite structure to achieve the required hermetic seal.

In further keeping with the invention, a cover wafer 34 is thereafter anodically bonded to the dielectric layer/glass film 32 so as to form a sealed cavity 36 to house and protect electronics 24. Again, wafer 34 is preferably comprised of silicon on the order of 500 angstroms in thickness and provides a vacuum-tight seal between the enclosed electronics and the outside world.

As those skilled in the art will recognize, anodic bonding is a technique used to form a permanent bond between a wafer such as silicon and a dielectric layer such as glass film 32 by bringing the silicon wafer and dielectric layer into contact by applying a high voltage at an elevated temperature which is typically in the range of 250°–300° C. At this temperature, ions are generally able to move such that the surface of the silicon wafer is able to react with the oxygen ions of the glass to form a strong silicon oxide bond. Similarly, alkali ions such as sodium and potassium, for example, are also able to move in the glass to compensate for the oxygen ion motion to the silicon wafer. This ion movement enables a bond to be anodically formed by the ion transfer which further results in a dipole layer which permanently bonds the silicon 34 to the dielectric layer/glass film 32.

FIG. 4 is a more detailed schematic cross-sectional diagram of the pressure sensor of FIG. 2 once the packaging steps of FIGS. 3a–3d have been followed. As shown, the pressure sensor includes a substrate 26 having a bond pad 28, a metal interconnect 29, and associated electronics 24. There is further shown a resistor 31 and a first pyrex/glass film layer 32. Still further, there is shown a cover or cap wafer made of a pyrex glass film 34.

The specific method steps of the present invention are further illustrated in FIG. 5 of the drawings. As shown, the method includes the provision 38 of a substrate having associated electronics and at least one metal bond pad. The method further includes sputter or vapor-depositing 40 a dielectric layer atop the substrate to form a dielectric/metal seal. Still further, the dielectric layer is polished 42 to remove surface variations. Finally, a cover is anodically bonded 44 to the dielectric layer so as to form a sealed cavity to house and protect the electronics.

Figure 1:
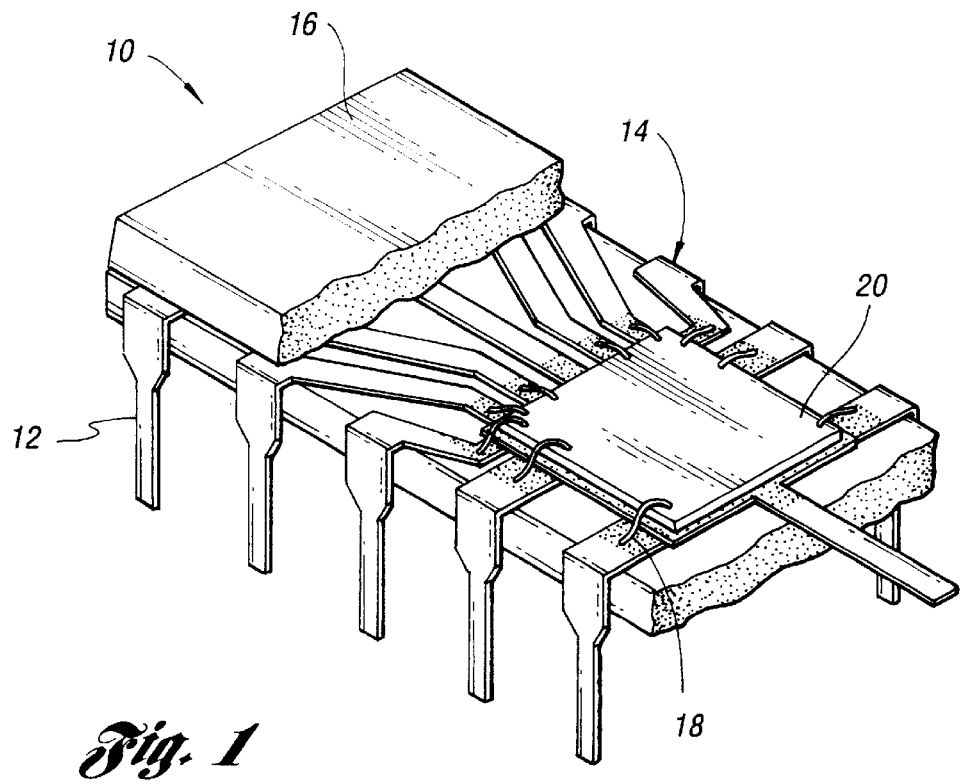
FIG. 1 is a schematic diagram illustrating a lead frame used in prior art packaging methods.

Significantly, the packaging method of the present invention provides for the manufacture of a microelectronic device such as a microchip or silicon-based sensor which is packaged in its own hermetically sealed container at the wafer level via a dielectric layer to silicon seal where the interconnects are embedded in a thermally matched glass forming a glass to metal seal on the microelectronic device itself. The packaging is done on a wafer scale thus allowing high volume production, low unit cost, controlled environmental conditions and reduced handling. The packaging scheme of the present invention also eliminates the need for an intermediate lead frame, as shown in FIG. 1, which results in a reduced total package size, which is important for improving electronic circuit board functionality at reduced module sizes.

Yet a further advantage of the present invention is that the resultant microelectronic device is hermetically sealed before the devices are individually separated from the wafer through a sawing operation. As those skilled in the art will recognize, sawing, i.e., cutting operations normally subject the microelectronic devices to silicon dust and other possible liquid contamination. In the past, the microelectronic devices had to be protected by an impervious encapsulating film such as vapor deposited silicon oxide and/or silicon nitride and sometimes followed with a polymer-lacquer type coating which is dissolved away after the sawing operation. The effectiveness of such encapsulating films are not always complete and may result in losses of yield after the sawing operation.

In contrast to the prior art, the present invention further provides for a microelectronic device wherein the lead frame is essentially part of the silicon microelectronic device package. Thus, the microelectronic device of the present invention, which is hermetically sealed at the wafer level, may be connected directly by wire lead 46—without fear of contamination to the device itself—directly to an integrated circuit board 48 as shown in FIG. 6. In an alternative embodiment contemplated for use with the present invention, the resultant microelectronic device may further be affixed to an integrated circuit board 48 in a flip chip arrangement as shown in FIG. 7 through the use of solder points 50.

While the best mode for carrying out the present invention has been described in detail, those familiar with the art to which this invention relates will recognize various alternative designs and embodiments for practicing the invention as defined by the following claims.

What is claimed is:

1. A hermetically sealed microelectronic device suitable for use as a microprocessor or computer chip, comprising:
    a substrate wafer having associated electronics and at least one metal bond pad;
    a dielectric layer deposited atop said substrate wafer to a thickness of at least two microns to form a dielectric/metal seal including a plurality of signal leads; and
    a cover wafer anodically bonded to said dielectric layer and defining a sealed cavity therebetween to house and protect said electronics, the dielectric layer having a coefficient of expansion thermally matched to the coefficients of expansion of the substrate wafer and the cover wafer and having no surface variations greater than 1000 Angstroms, whereby said microelectronic device is packaged in its own container and hermetically sealed.

2. A microelectronic device as in claim 1, wherein said substrate comprises silicon.

3. A microelectronic device as in claim 1, wherein said cover wafer comprises silicon.

4. A microelectronic device as in claim 1, wherein said dielectric layer comprises pyrex glass.

5. A microelectronic device as in claim 1, wherein said cover wafer is 500 microns in thickness.

6. A microelectronic device as in claim 1, wherein said substrate is 500 microns in thickness.

* * * * *